(12) United States Patent
Zhang et al.

(10) Patent No.: US 9,895,711 B2
(45) Date of Patent: Feb. 20, 2018

(54) SUBSTRATE LIQUID PROCESSING APPARATUS, SUBSTRATE LIQUID PROCESSING METHOD AND SUBSTRATE PROCESSING APPARATUS

(71) Applicant: Tokyo Electron Limited, Tokyo (JP)

(72) Inventors: Jian Zhang, Kumamoto (JP);
Yoshifumi Amano, Kumamoto (JP);
Eiichiro Okamoto, Kumamoto (JP);
Yuki Ito, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/005,516

(22) Filed: Jan. 25, 2016

(65) Prior Publication Data

US 2016/0221046 A1 Aug. 4, 2016

(30) Foreign Application Priority Data

Feb. 3, 2015 (JP) .................................. 2015-019231
Jul. 14, 2015 (JP) .................................. 2015-140594

(51) Int. Cl.
*H01L 21/67* (2006.01)
*H01L 21/687* (2006.01)
*H01L 21/02* (2006.01)
*B05C 11/00* (2006.01)

(52) U.S. Cl.
CPC .......... *B05C 11/00* (2013.01); *H01L 21/6715* (2013.01); *H01L 21/68792* (2013.01); *B08B 2203/0229* (2013.01)

(58) Field of Classification Search
CPC .............................. H01L 21/68714–21/68792
See application file for complete search history.

(56) References Cited

U.S. PATENT DOCUMENTS

| 2014/0182631 A1* | 7/2014 | Namba ............. H01L 21/67051 134/33 |
| 2014/0197610 A1* | 7/2014 | Miyazaki .......... H01L 21/68728 279/133 |
| 2014/0331927 A1* | 11/2014 | Nakano ................... H01L 21/00 118/641 |

FOREIGN PATENT DOCUMENTS

| JP | 09-045750 A | 2/1997 |
| JP | 2009-117794 A | 5/2009 |
| JP | 2011-243627 A | 12/2011 |

* cited by examiner

*Primary Examiner* — Spencer E Bell
(74) *Attorney, Agent, or Firm* — Abelman, Frayne & Schwab

(57) ABSTRACT

A substrate liquid processing apparatus including: a substrate rotary-holding unit configured to rotate a substrate while holding the substrate; and a processing liquid supply unit configured to supply a processing liquid to a bottom surface of the substrate held by the substrate rotary-holding unit. The substrate rotary-holding unit includes: a base plate disposed spaced apart from the substrate below the substrate; a cover member supported by the base plate and disposed outside an outer periphery of the substrate; and a discharge port formed between the base plate and the cover member and configured to discharge an air stream occurring below the substrate. The support portion of the base plate and the cover member protrudes outwards from a top surface of the base plate to be connected to the cover member.

11 Claims, 10 Drawing Sheets

SUBSTRATE LIQUID PROCESSING APPARATUS, SUBSTRATE LIQUID PROCESSING METHOD AND SUBSTRATE PROCESSING APPARATUS

CROSS-REFERENCE TO RELATED APPLICATIONS

This application is based on and claims priority from Japanese Patent Application Nos. 2015-019231 and 2015-140594, filed on Feb. 3, 2015 and Jul. 14, 2015, respectively, with the Japan Patent Office, the disclosures of which are incorporated herein in their entireties by reference.

TECHNICAL FIELD

The present disclosure relates to a substrate liquid processing apparatus configured to perform a liquid processing on a bottom surface of a substrate using a processing liquid, a substrate liquid processing method, and a substrate processing apparatus.

BACKGROUND

When, for example, a semiconductor part or a flat panel display is manufactured, a liquid processing has conventionally been performed using various processing liquids on a substrate such as, for example, a semiconductor wafer or a liquid crystal substrate by a substrate liquid processing apparatus.

In the substrate liquid processing apparatus, a processing such as, cleaning, film formation, or etching, may be performed on a top surface of a substrate (a main surface: a circuit forming surface), and a processing such as cleaning may also be performed on a rear surface of the substrate. In this case, the substrate is held while the rear surface of the substrate is downward, and a processing liquid is supplied toward the rear surface (the bottom surface) of the substrate so as to perform a liquid processing on the bottom surface of the substrate by the processing liquid.

In a substrate liquid processing apparatus configured to perform a liquid processing on the bottom surface of the substrate, a disk-shaped base plate is disposed below the substrate, and a processing liquid is ejected from the center of the base plate to the bottom surface of the substrate at the upper side. Around the base plate, an annular-shaped cover member is provided. The cover member is supported by a plurality of struts disposed at intervals in the circumferential direction at the outer periphery portion of the base plate. Between the base plate and the cover member, a slit-shaped drain port is formed to discharge the processing liquid along the outer periphery of the base plate.

In the substrate liquid processing apparatus, the substrate is held and rotated by rotating the base plate, and the processing liquid is supplied toward the bottom surface of the rotating substrate to perform a liquid processing on the bottom surface of the substrate, and the processing liquid which has been used for the liquid processing is discharged from the drain port.

Also, a substrate processing apparatus configured to perform a substrate processing such as a cleaning processing on a substrate such as a substrate wafer or a glass substrate by supplying a predetermined processing liquid has been conventionally known.

A substrate processing apparatus, for example, includes a support unit rotatably provided to support a substrate from the lower side, and a processing liquid supply unit configured to supply a processing liquid to the bottom surface of the substrate supported by the support unit, and performs a processing on the bottom surface of the substrate by the processing liquid while rotating the substrate (see, e.g., Japanese Patent Laid-Open Publication No. 2011-243627).

The support unit of such a substrate processing apparatus includes a support pin configured to support the substrate by coming in contact with the bottom surface of the periphery edge of the substrate, and an enclosure member configured to surround the periphery edge portion of the substrate over the entire circumference at the outside of the periphery edge of the substrate. The enclosure member is a liquid receiver, and performs a role of guiding the processing liquid which has been used for processing the substrate so that the processing liquid is drained.

SUMMARY

The present disclosure provides a substrate liquid processing apparatus including: a substrate rotary-holding unit configured to rotate a substrate while holding the substrate; and a processing liquid supply unit configured to supply a processing liquid to the substrate held by the substrate rotary-holding unit. The substrate rotary-holding unit includes: a base plate disposed spaced apart from the substrate below the substrate; a cover member supported on the base plate by a support portion and disposed outside an outer periphery of the substrate; and a discharge port formed between the base plate and the cover member and configured to discharge an air stream occurring below the substrate. The support portion of the base plate and the cover member protrudes outwards from a top surface of the base plate to be connected to the cover member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
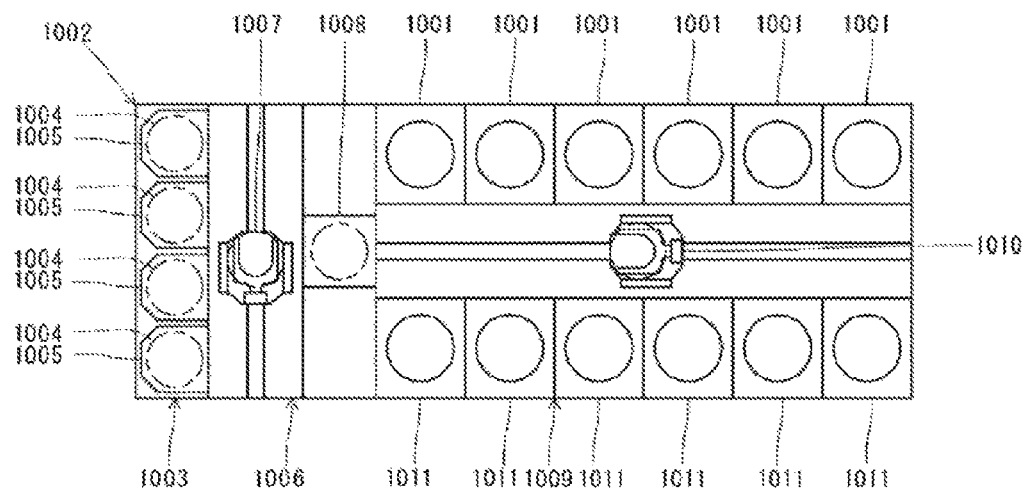
FIG. 1 is a plan view illustrating a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above described conventional substrate liquid processing apparatus, when the substrate is subjected to a liquid processing by the processing liquid, a turning air stream occurs at the outside of the outer periphery of the substrate due to the rotation of the substrate, and a liquid stream occurs due to the flow of the processing liquid toward the drain port.

In the conventional substrate liquid processing apparatus, since the plurality of struts configured to support the cover member are provided, on the base plate, at the outside of the outer periphery of the substrate, the air stream or the liquid stream collides with the struts at the outside of the outer periphery of the substrate.

When the air stream collides with the struts, the air stream is disturbed, and thus the flow velocity distribution becomes non-uniform. Therefore, the temperature of the substrate partially drops at the outer circumferential edge of the substrate (the temperature distribution becomes non-uniform). As a result, the outer circumferential edge of the substrate may not be uniformly subjected to the liquid processing using the processing liquid.

Accordingly, according to the present disclosure, a substrate liquid processing apparatus includes: a substrate rotary-holding unit configured to rotate a substrate while holding the substrate; and a processing liquid supply unit configured to supply a processing liquid to the substrate held by the substrate rotary-holding unit.

The substrate rotary-holding unit includes: a base plate disposed spaced apart from the substrate below the substrate; a cover member supported on the base plate by a support portion and disposed outside an outer periphery of the substrate; and a discharge port formed between the base plate and the cover member and configured to discharge an air stream occurring below the substrate. The support portion of the base plate and the cover member protrudes outwards from a top surface of the base plate to be connected to the cover member.

The support portion of the base plate and the cover member is formed below a bottom surface of the substrate.

An upper end face of the support portion of the base plate and the cover member is formed on the same plane as the top surface of the base plate.

The processing liquid supply unit supplies the processing liquid to the bottom surface of the substrate, and the discharge port discharges the processing liquid supplied from the processing liquid supply unit.

The support portions of the base plate and the cover member are formed between a plurality of substrate holders configured to support the substrate and provided at intervals along the outer periphery of the substrate.

The support portions of the base plate and the cover member, and the substrate holders are formed at equal intervals along the outer periphery of the substrate.

The substrate liquid processing apparatus includes a plurality of support members provided on the top surface of the base plate to support the substrate.

The plurality of support members include a first support member made of a conductive resin, a conductive member is disposed within the base plate to be in contact with the first support member, and the substrate is electrically conductive through the first support member and the conductive member.

The plurality of support members include a second support member made of a resin having a conductivity lower than the first support member.

The number of the first support members is smaller than the number of the second support members.

The support members are detachable from the top surface side of the base plate.

A protrusion is formed on the cover member to extend downwards from the cover member, and the protrusions are formed at a plurality of locations along the outer periphery of the substrate, and extend to positions lower than a top surface of the substrate.

In the present disclosure, a substrate liquid processing method includes: rotating a substrate by a substrate rotary-holding unit while holding the substrate, supplying a processing liquid to the substrate from a processing liquid supply unit and performing a liquid processing on the substrate by the processing liquid, and discharging, during the liquid processing, an air stream occurring below the substrate from a discharge port formed between a base plate and a cover member provided in the substrate rotary-holding unit while the base plate and the cover member are connected at a support portion, the base plate being disposed spaced apart from the substrate below the substrate, and the cover member being disposed outside an outer periphery of the substrate.

In the present disclosure, it is possible to satisfactorily perform a liquid processing on the substrate without suppressing an air stream occurring at the outside of the outer periphery of the substrate during the liquid processing of the substrate.

Hereinafter, a specific configuration of a substrate liquid processing apparatus and a substrate liquid processing method according to the present disclosure will be described with reference to drawings.

Hereinafter, for convenience of explanation, among some constitutional elements including a plurality of components, reference numerals may be given to only some of the plurality of components, but may be omitted in others of the components.

[First Exemplary Embodiment]

As illustrated in FIG. 1, a substrate processing system 1002 mounted with a substrate liquid processing apparatus 1001 according to the present disclosure includes a carry-in/out unit 1003 at the front end thereof. A carrier 1005 which accommodates a plurality of substrates 1004 (e.g., 25 substrates) (herein, semiconductor wafers) is carried into or out of the carry-in/out unit 1003. The carriers 1005 are placed to be laterally aligned.

The substrate processing system 1002 includes a conveyance unit 1006 at the rear side of the carry-in/out unit 1003. A substrate conveyance device 1007 is disposed at the front side of the conveyance unit 1006, and a substrate delivery unit 1008 is disposed at the rear side of the conveyance unit 1006. In the conveyance unit 1006, the substrates 1004 are conveyed using the substrate conveyance device 1007 between any of the carriers 1005 to be placed on the carry-in/out unit 1003 and the substrate delivery unit 1008.

The substrate processing system 1002 includes a processing unit 1009 at the rear side of the conveyance unit 1006. The processing unit 1009 includes a substrate conveyance device 1010 extending in a front and rear direction, which is disposed at the center of the processing unit 1009. A plurality of substrate liquid processing apparatuses 1011 (here, six substrate liquid processing apparatuses) configured to perform a liquid processing on the front surface (a main surface: a circuit forming surface) of the substrate 1004, and a plurality of substrate liquid processing apparatuses 1001 (here, six substrate liquid processing apparatuses) configured to perform a liquid processing on the rear surface of the substrate 1004 are disposed across the substrate conveyance device 1010 at both sides of the processing unit 1009 to be aligned in the front and rear direction. In the processing unit 1009, the substrates 1004 are conveyed between the substrate delivery unit 1008 and the substrate liquid processing apparatuses 1001 and 1011 using the substrate conveyance device 1010, and liquid processings of the substrates 1004 are performed using the respective substrate liquid processing apparatuses 1001 and 1011. As the substrate liquid processing apparatus 1011 configured to perform a liquid processing on the front surface of the substrate 1004, a conventionally known apparatus may be employed, and thus descriptions on the specific configuration of the apparatus will be omitted.

The substrate liquid processing apparatus 1001 configured to perform a liquid processing on the rear surface of the substrate 1004 is a main part of the present disclosure, and its specific configuration will be described below.

Figure 2:
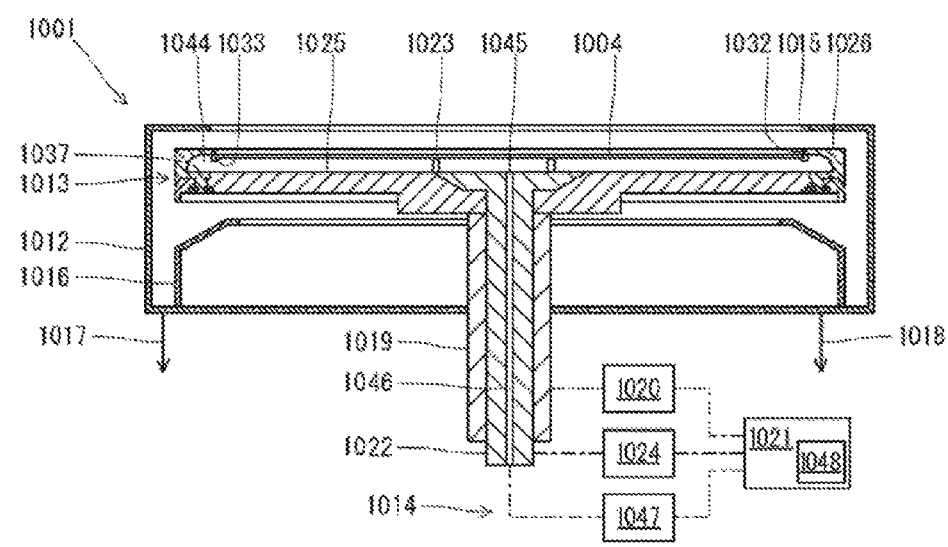
FIG. 2 is a side view illustrating a substrate liquid processing apparatus.
Figure 3:
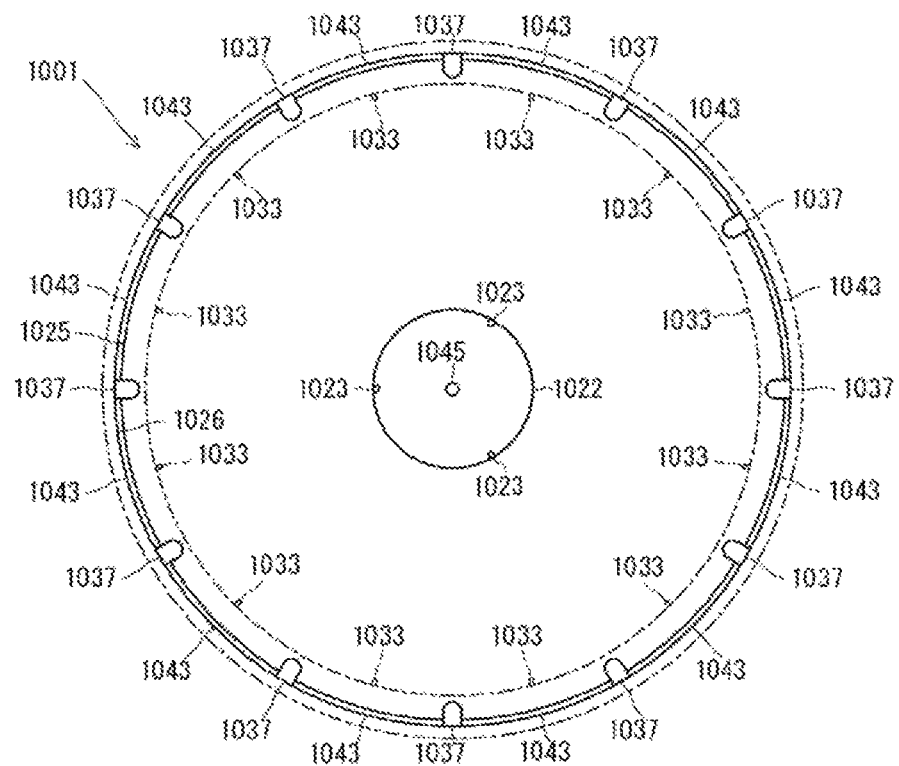
FIG. 3 is a plan view of the same.

The substrate liquid processing apparatus 1001, as illustrated in FIGS. 2 and 3, includes a substrate rotary-holding unit 1013 configured to rotate the substrate 1004 while holding the substrate 1004 in a chamber 1012, and a processing liquid supply unit 1014 configured to supply a processing liquid to the rear surface (the bottom surface) of the substrate 1004.

The chamber 1012 has an opening 1015 formed at the top portion thereof, to/from which the substrate 1004 is carried. The chamber 1012 has an annular partition wall 1016 formed therein. A liquid drain 1017 configured to discharge the processing liquid is connected at the outside of the partition wall 1016, and an exhaust drain 1018 configured to discharge an air is connected at the inside of the partition wall 1016.

The substrate rotary-holding unit 1013 includes a vertically extending cylindrical rotation shaft 1019, which is rotatably provided in the central portion of the chamber 1012. A rotation driving mechanism 1020 is connected to the rotation shaft 1019. The driving of the rotation driving mechanism 1020 is controlled by a controller 1021.

The substrate rotary-holding unit 1013 includes a vertically extending a lifting member 1022, which is provided in a liftable manner in a hollow portion of the rotation shaft 1019. Three supports 1023 are formed on the upper end face of the lifting member 1022 at equal intervals in the circumferential direction to support the substrate 1004 from the lower side. A lift driving mechanism 1024 is connected to the lifting member 1022. The lifting of the lift driving mechanism 1024 is controlled by the controller 1021.

The substrate rotary-holding unit 1013 includes a disk-shaped base plate 1025 attached to the upper end portion of the rotation shaft 1019, and an annular cover member 1026 attached to the base plate 1025.

The base plate 1025 has an upper end face 1027 formed on the same horizontal plane as the upper end face of the lifting member 1022. The base plate 1025 has an inclined (conical) outer peripheral surface 1028 formed at the outer circumferential edge thereof, the outer peripheral surface 1028 enlarging in diameter downwards. The base plate 1025 is disposed spaced apart from the bottom surface of the substrate 1004 below the substrate 1004 in a state where the substrate 1004 is held by the substrate rotary-holding unit 1013. In the base plate 1025, the upper end face 1027 is wider (larger in diameter) than the substrate 1004, and an annular upper-end-face edge portion 1029 is formed below the outside of the outer periphery of the substrate 1004.

Figure 4A:
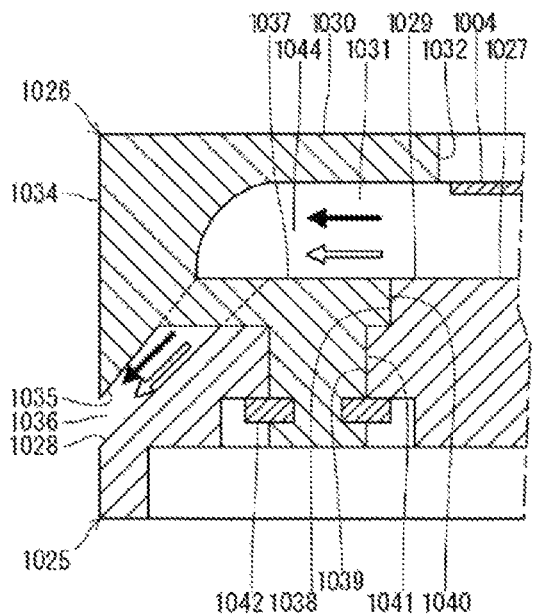
FIGS. 4A and 4B are side views of the same in an enlarged scale.
Figure 4B:
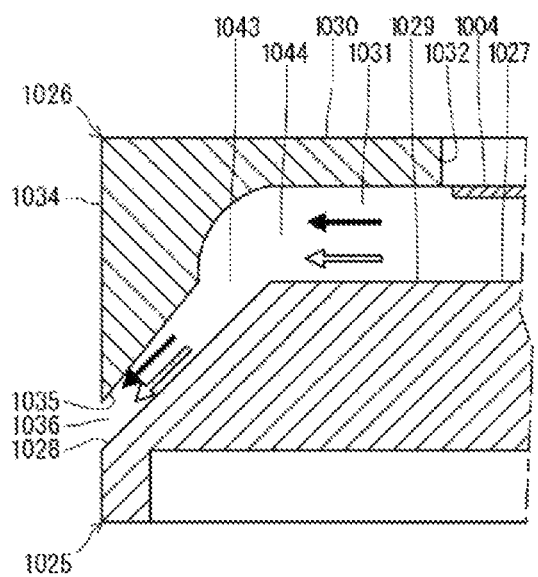
Figure 5:
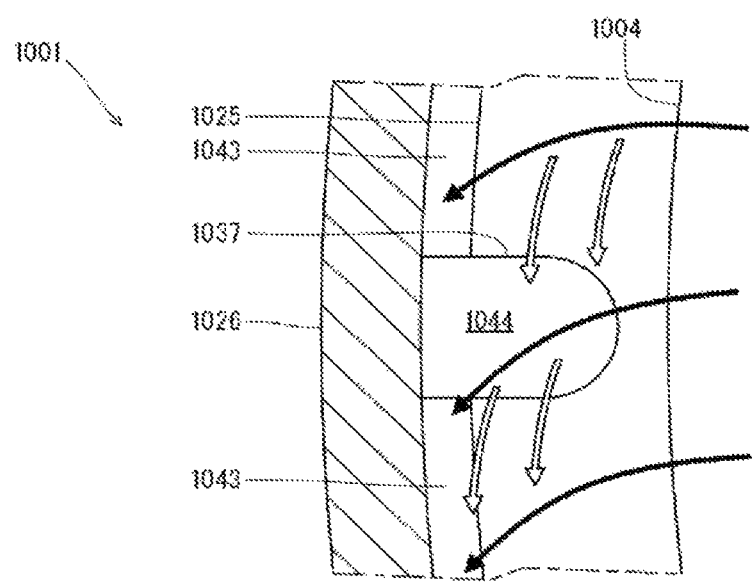
FIG. 5 is a plan view of the same in an enlarged scale.

The cover member 1026 has an annular ceiling wall 1030 formed at the top portion thereof. The ceiling wall 1030 covers the upper side of the upper-end-face edge portion 1029 of the base plate 1025. A horizontal flow path 1031 having a constant vertical spacing is formed between the bottom surface of the ceiling wall 1030 and the upper-end-face edge portion 1029 of the base plate 1025 (see, e.g., FIGS. 4A and 4B). An opening 1032 is formed at the inner periphery side of the ceiling wall 1030, to/from which the substrate 1004 is carried. Twelve substrate holders 1033 configured to hold the substrate 1004 are formed at the lower side of the inner periphery side of the ceiling wall 1030 at equal intervals in the circumferential direction. The substrate holders 1033 protrude to the inside of the opening 1032, and hold the substrate 1004 while supporting the outer circumferential edge of the bottom surface of the substrate 1004 from the lower side. The cover member 1026 is disposed outside the outer periphery of the substrate 1004 in a state where the substrate 1004 is held by the substrate holders 1033. As described above, the ceiling wall 1030 of the cover member 1026 is located to be higher than the bottom surface of the substrate 1004.

The cover member 1026 has an annular outer periphery wall 1034 formed at the outer periphery portion of the ceiling wall 1030. The outer periphery wall 1034 has an inclined (conical) inner peripheral surface 1035 formed on the inner surface thereof, the inner peripheral surface 1035 enlarging in diameter downwards. The outer periphery wall 1034 covers the outer side (the upper side) of the outer peripheral surface 1028 of the base plate 1025. An inclined flow path 1036 having a vertical spacing is formed between the inner peripheral surface 1035 of the outer periphery wall 1034 and the outer peripheral surface 1028 of the base plate 1025 (see, e.g., FIGS. 4A and 4B). As described above, the lower end of the outer periphery wall 1034 of the cover member 1026 is located to be lower than the bottom surface of the substrate 1004.

The cover member 1026 is supported by the base plate 1025. Hereinafter, the structure of a support portion 1037 of the base plate 1025 and the cover member 1026 will be described.

Twelve support portions 1037 are formed, as illustrated in FIGS. 2 to 5, at the outer circumferential edge of the base plate 1025 at equal intervals in the circumferential direction in plan view. The respective support portions 1037 are disposed between (preferably in the middle of) the twelve substrate holders 1033 formed on the cover member 1026 at equal intervals in the circumferential direction. The width of the support portion 1037 in the circumferential direction is sufficiently smaller than the width between two support portions 1037 (e.g., ⅛).

Each support portion 1037 has a support groove 1038 formed on the outer circumferential edge (the upper-end-face edge portion 1029) of the base plate 1025 to extend in the radial direction, and a support hole 1039 formed to vertically penetrate the support groove 1038. Each support portion 1037 has a support piece 1040 formed at the inside (the inner peripheral surface 1035) of the outer periphery wall 1034 of the cover member 1026 to extend in the radial direction, and a support protrusion 1041 formed at the distal end of the support piece 1040 to vertically extend. The support groove 1038 of the base plate 1025 and the support piece 1040 of the cover member 1026 have substantially the same widths. The support hole 1039 of the base plate 1025 and the support protrusion 1041 of the cover member 1026 have substantially the same diameters. In each support portion 1037, the support piece 1040 and the support protrusion 1041 of the cover member 1026 are fitted into the support groove 1038 and the support hole 1039 of the base plate 1025 so that the cover member 1026 is detachably supported by the base plate 1025. The support protrusion 1041 of the cover member 1026 is fastened using a ring-shaped fastening member 1042 at the lower side of the support hole 1039 of the base plate 1025. In a state where the cover member 1026 is supported by the base plate 1025, an arc-shaped slit-like discharge port 1043 is formed between the outer circumferential edge (the upper-end-face edge portion 1029) of the upper end face 1027 of the base plate 1025, and the upper end portion of the inner peripheral surface 1035 of the outer periphery wall 1034 of the cover member 1026. In the discharge port 1043, the horizontal flow path 1031 and the inclined flow path 1036 formed between the base plate 1025 and the cover member 1026 are communicated with each other.

The support portion 1037 of the base plate 1025 and the cover member 1026 is formed such that the upper end face (the top surface of the support piece 1040) is located to be lower than the inside upper end face (the bottom surface of the ceiling wall 1030) of the cover member 1026. Accordingly, a gap 1044 having a constant vertical spacing is formed between the support portion 1037 and the inside upper end face (the bottom surface of the ceiling wall 1030) of the cover member 1026. The gap 1044 is communicated with the horizontal flow path 1031 and the inclined flow path 1036 formed between the base plate 1025 and the cover member 1026. In the gap 1044, as described below, a processing liquid supplied from the processing liquid supply unit 1014, or an air flows.

The processing liquid supply unit 1014 has an ejecting port 1045 formed at the center of the upper end face of the lifting member 1022, and an ejecting flow path 1046 formed in the central axis of the lifting member 1022 to extend vertically. A processing liquid supply mechanism 1047 is connected to the ejecting port 1045 through the ejecting flow path 1046. The flow rate of the processing liquid supply mechanism 1047 is controlled by the controller 1021.

The controller 1021 controls the operations of respective parts of the substrate processing system 1002 as well as the substrate liquid processing apparatus 1001. The controller 1021 is, for example, a computer, and includes a computer-readable storage medium 1048. The storage medium 1048 stores a program which controls various processings to be executed in the substrate processing system 1002. The controller 1021 controls the operations of the substrate processing system 1002 by reading out and executing the program stored in the storage medium 1048. The program has been stored in the computer-readable storage medium 1048, but may be installed to the storage medium 1048 of the controller 1021 from another storage medium. Examples of the computer-readable storage medium 1048 may include a hard disk (HD), a flexible disk (FD), a compact disk (CD), a magneto-optical disk (MO), and a memory card.

The substrate processing system 1002 having the substrate liquid processing apparatus 1001 is configured as described above, and processes the substrate 1004 by controlling the operation of each part using the controller 1021.

When the substrate liquid processing apparatus 1001 performs a liquid processing on the rear surface of the substrate 1004 using a processing liquid such as, for example, a cleaning liquid, the substrate liquid processing apparatus 1001 is controlled by the controller 1021 according to a substrate liquid processing program stored in the storage medium 1048 as described below.

First, the controller 1021 carries the substrate 1004 into the substrate liquid processing apparatus 1001 (a substrate carry-in step). In the substrate carry-in step, the lifting member 1022 is raised by the lift driving mechanism 1024, and the substrate 1004 is placed on the top portions of the supports 1023 of the lifting member 1022 from the upper side by the substrate conveyance device 1010 while the rear surface of the substrate 1004 faces downwards. Then, the lifting member 1022 is lowered by the lift driving mechanism 1024, and the substrate 1004 is placed on the top portions of the substrate holders 1033 from the upper side. Accordingly, the substrate 1004 is held by the substrate rotary-holding unit 1013 (the substrate holders 1033) in a state where the rear surface of the substrate 1004 faces downwards.

Then, the controller 1021 performs a liquid processing on the bottom surface (the rear surface) of the substrate 1004 using a processing liquid (a substrate liquid processing step). In the substrate liquid processing step, the rotation shaft 1019 is rotated at a predetermined rotational speed by the rotation driving mechanism 1020 so that the base plate 1025 and the cover member 1026 are rotated. Accordingly, the substrate 1004 is rotated together with the base plate 1025 and the cover member 1026. Then, a processing liquid at a predetermined temperature, a predetermined concentration and a predetermined flow rate is ejected toward the central portion of the bottom surface of the substrate 1004 from the ejecting port 1045 by the processing liquid supply mechanism 1047. The processing liquid ejected to the central portion of the bottom surface of the substrate 1004 flows toward the outside of the outer periphery of the substrate 1004 along the bottom surface of the substrate 1004 by the rotation of the substrate 1004. Accordingly, the bottom surface of the substrate 1004 is subjected to the liquid processing by the processing liquid. After a predetermined time is elapsed, the ejection of the processing liquid and the rotation of the substrate 1004 are stopped.

Then, the controller 1021 carries the substrate 1004 out of the substrate liquid processing apparatus 1001 (a substrate carry-out step). In the substrate carry-out step, the lifting member 1022 is raised by the lift driving mechanism 1024, and the substrate 1004 is raised while the bottom surface of the substrate 1004 is supported at the top portions of the supports 1023 from the lower side. Then, the substrate 1004 is carried out by the substrate conveyance device 1010.

As described above, the substrate 1004 may be subjected to the liquid processing by the substrate liquid processing apparatus 1001. At this time, in the substrate liquid processing step, the surrounding air (atmosphere) of the substrate 1004 is flowed by the rotation of the substrate 1004, and thus an air stream (indicated by white arrows in FIGS. 4A, 4B and 5) flowing in the circumferential direction occurs at the outside of the outer periphery of the substrate 1004. The air stream flows in the horizontal flow path 1031 to be directed in the circumferential direction of the substrate 1004 and flows to the inclined flow path 1036 through the discharge port 1043. The air stream flows from the inside of the partition wall 1016 to the exhaust drain 1018. When the air stream flows in the horizontal flow path 1031, the air stream may flow into the gap 1044 without colliding with the support portion 1037 because the gap 1044 is formed at the upper side of the support portion 1037 of the base plate 1025 and the cover member 1026 (between the support portion 1037 and the inside upper end face (the bottom surface of the ceiling wall 1030) of the cover member 1026). Accordingly, the flow velocity distribution of the air stream may be maintained in a uniform state, and the temperature distribution of the bottom surface of the substrate 1004 may be maintained in a uniform state. As a result, the bottom surface of the substrate 1004 may be uniformly subjected to the liquid processing using the processing liquid.

In the substrate liquid processing step, the processing liquid is flowed by the supply of the processing liquid and the rotation of the substrate 1004, and thus a liquid stream (indicated by black arrows in FIGS. 4A, 4B and 5) flowing toward the outside of the outer periphery of the substrate 1004 occurs. The liquid stream flows in the horizontal flow path 1031 to be directed in the radial direction of the substrate 1004 and flows to the inclined flow path 1036 through the discharge port 1043. The liquid stream flows from the outside of the partition wall 1016 to the liquid drain 1017. When the liquid stream flows in the horizontal flow path 1031, the liquid stream may be suppressed from colliding with the support portion 1037 so that the processing liquid may not be scattered because the gap 1044 is formed at the upper side of the support portion 1037 of the base plate 1025 and the cover member 1026 (between the support portion 1037 and the inside upper end face (the bottom surface of the ceiling wall 1030) of the cover member 1026). Thus, it is possible to suppress occurrence of watermarks or remaining of particles which may be caused by the scattering of the processing liquid. As a result, the bottom surface of the substrate 1004 may be satisfactorily subjected to the liquid processing using the processing liquid.

In order to allow the air stream or the liquid stream to further smoothly flow by the gap 1044, the upper end face of the support portion 1037 (the top surface of the support piece 1040) may be preferably formed to be lower than the bottom surface of the substrate 1004, and may be most preferably formed on the same plane as the top surface (the upper end face 1027) of the base plate 1025, and the support portion 1037 may preferably protrude outwards from the top surface (the upper end face 1027) of the base plate 1025 to be connected to the cover member 1026. In order to allow the air stream or the liquid stream to uniformly flow at the outside of the outer periphery of the substrate 1004, the support portions 1037 may be preferably formed at equal intervals along the outer periphery of the substrate 1004, and the support portions 1037 may be most preferably formed between the substrate holders 1033 provided at equal intervals along the outer periphery of the substrate 1004.

As described above, in the substrate liquid processing apparatus 1001 (the substrate liquid processing method), since the gap 1044 is formed between the support portion 1037 of the base plate 1025 and the cover member 1026 and the inside upper end face of the cover member 1026, the air stream or the liquid stream occurring during the processing of the substrate 1004 may be flowed into the gap 1044 so that the air stream or the liquid stream may be suppressed from colliding with the support portion 1037. Accordingly, in the substrate liquid processing apparatus 1001 (the substrate liquid processing method), it is possible to satisfactorily perform a liquid processing on the substrate 1004 without suppressing an air stream or a liquid stream occurring at the outside of the outer periphery of the substrate 1004 during the processing of the substrate 1004. In the present exemplary embodiment, the substrate liquid processing step is performed by supplying a liquid to the bottom surface of the substrate, but the present disclosure may be employed even in a case where a liquid is supplied to both the top and bottom surfaces or to only the top surface. When the liquid is supplied to only the top surface of the substrate, the liquid stream does not occur on the bottom surface of the substrate, but the air stream occurs in the same manner as in the exemplary embodiment described above. This affects the top surface of the substrate due to a temperature drop. Accordingly, when the same configuration as in the exemplary embodiment is employed, the flow velocity distribution of the air stream on the bottom surface may be maintained in a uniform state, so that the influence on the top surface may be mitigated, and also the temperature distribution of the top surface of the substrate may be maintained in a uniform state.

[Second Exemplary Embodiment]

In the above described substrate processing apparatus in Japanese Patent Laid-Open Publication No. 2011-243627, the support pin and the enclosure member are integrally formed although they have different conditions for cleaning or exchange. Thus, there is a room for further improvement of a device maintainability.

An object of an aspect of the exemplary embodiment is to provide a substrate processing apparatus with an improved device maintainability.

Figure 6:
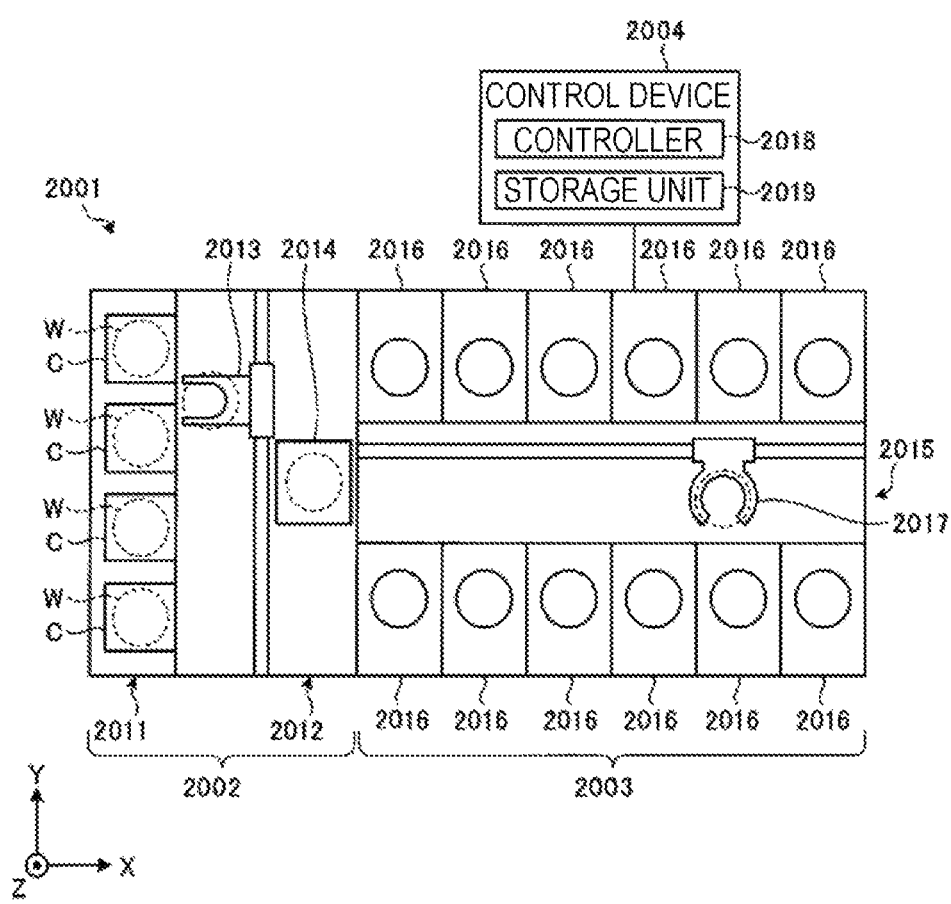
FIG. 6 is a view illustrating a schematic configuration of a substrate processing system according to an exemplary embodiment.

FIG. 6 is a view illustrating a schematic configuration of a substrate processing system according to the present exemplary embodiment. In the following, in order to clarify the positional relationship, the X-axis, Y-axis, and Z-axis which are orthogonal to each other are defined. The positive Z-axis direction is regarded as a vertically upward direction.

As illustrated in FIG. 6, a substrate processing system 2001 includes a carry-in/out station 2002 and a processing station 2003. The carry-in/out station 2002 and the processing station 2003 are provided adjacent to each other.

The carry-in/out station 2002 includes a carrier placing section 2011 and a conveyance section 2012. In the carrier placing section 2011, a plurality of carriers C are placed to accommodate a plurality of substrates (semiconductor wafers in the present exemplary embodiment) (hereinafter, referred to as "wafers W") horizontally.

The conveyance section 2012 is provided adjacent to the carrier placing section 2011, and includes a substrate conveyance device 2013 and a delivery unit 2014 therein. The substrate conveyance device 2013 includes a wafer holding mechanism configured to hold a wafer W. The substrate conveyance device 2013 is movable horizontally and vertically and pivotable around a vertical axis, and conveys wafers W between the carriers C and the delivery unit 2014 by using the wafer holding mechanism.

The processing station 2003 is provided adjacent to the conveyance section 2012. The processing station 2003 includes a conveyance section 2015 and a plurality of processing units 2016. The plurality of processing units 2016 are provided at both sides of the conveyance section 2015 to be aligned.

The conveyance section 2015 includes a substrate conveyance device 2017 therein. The substrate conveyance device 2017 includes a wafer holding mechanism configured to hold a wafer W. The substrate conveyance device 2017 is movable horizontally and vertically and pivotable around a vertical axis, and conveys wafers W between the delivery unit 2014 and the processing units 2016 by using the wafer holding mechanism.

Each of the processing units 2016 performs a predetermined substrate processing on wafers W conveyed by the substrate conveyance device 2017.

The substrate processing system 2001 includes a control device 2004. The control device 2004 is, for example, a computer, and includes a controller 2018 and a storage unit 2019. The storage unit 2019 stores a program which controls various processings to be executed in the substrate processing system 2001. The controller 2018 controls the operations of the substrate processing system 2001 by reading out and executing the program stored in the storage unit 2019.

The program has been stored in the computer-readable storage medium, but may be installed to the storage unit 2019 of the control device 2004 from the storage medium. Examples of the computer-readable storage medium may include a hard disk (HD), a flexible disk (FD), a compact disk (CD), a magneto-optical disk (MO), and a memory card.

In the substrate processing system 2001 configured as described above, first, the substrate conveyance device 2013 of the carry-in/out station 2002 takes out a wafer W from a carrier C placed in the carrier placing section 2011, and then places the taken-out wafer W on the delivery unit 2014. The wafer W placed on the delivery unit 2014 is taken out from the delivery unit 2014 by the substrate conveyance device 2017 of the processing station 2003 and carried into the processing unit 2016.

The wafer W carried into the processing unit 2016 is processed by the processing unit 2016, and then, carried out from the processing unit 2016 and placed on the delivery unit 2014 by the substrate conveyance device 2017. The processed wafer W placed on the delivery unit 2014 returns to the carrier C of the carrier placing section 2011 by the substrate conveyance device 2013.

Figure 7:
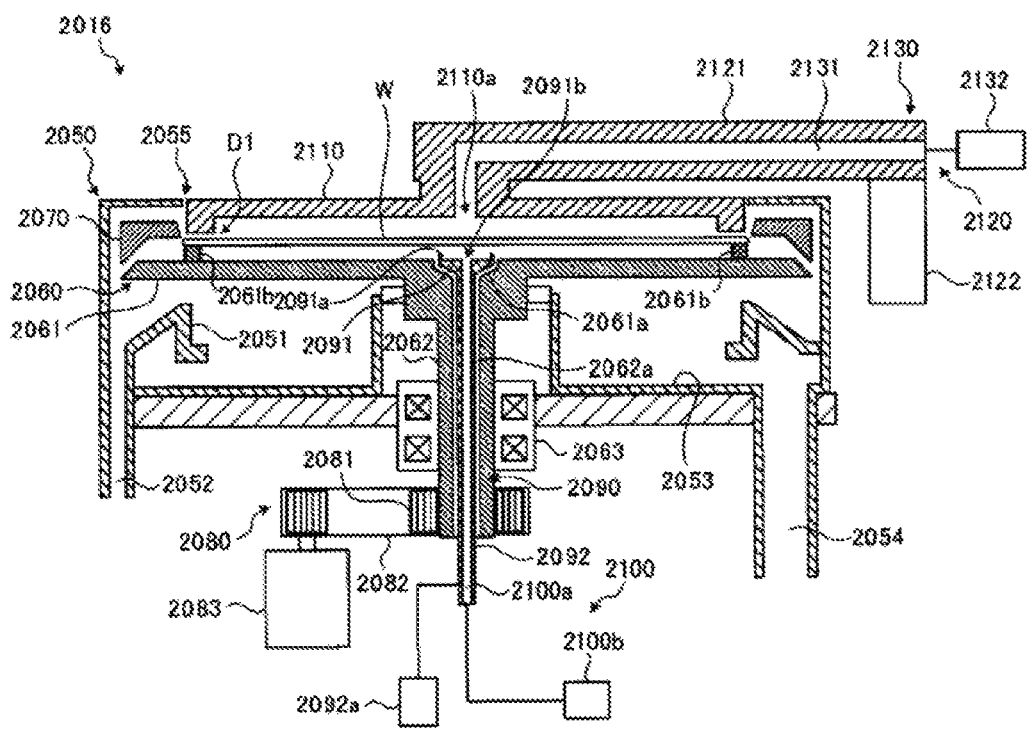
FIG. 7 is a schematic sectional view illustrating a configuration of a processing unit.

Hereinafter, a schematic configuration of the processing unit 2016 will be described with reference to FIG. 7. FIG. 7 is a schematic sectional view illustrating a configuration of the processing unit 2016.

As illustrated in FIG. 7, the processing unit 2016 includes a recovery cup 2050, a rotary plate 2060, a rotary ring 2070, a rotary driving unit 2080, a substrate lifting mechanism 2090, a processing liquid supply unit 2100, a top plate 2110, a lifting mechanism 2120 and an inert gas supply unit 2130.

The recovery cup 2050, the rotary plate 2060, and the rotary ring 2070 are accommodated in a chamber (not illustrated). A fan filter unit (FFU) (not illustrated) is provided on the ceiling of the chamber. The FFU forms a down flow in the chamber.

The rotary plate 2060 includes a base plate 2061 and a rotation shaft 2062. The base plate 2061 is horizontally provided and has a circular recessed portion 2061*a* at the center thereof. On the top surface of the base plate 2061, a plurality of support pins 2061*b* are provided to protrude upwards, and support a wafer W from the lower side while the wafer W is floated above the base plate 2061. Details of the support pins 2061*b* will be described below with reference to drawings subsequent to FIG. 8A.

The rotation shaft 2062 is provided to extend downwards from the base plate 2061, and has a cylindrical shape with a through hole 2062*a* formed at the center thereof. The rotation shaft 2062 is rotatably pivotally supported by a bearing 63.

The rotary ring 2070 is disposed at the outside of the outer periphery of the wafer W supported by the base plate 2061, and is provided to surround the periphery edge portion of the wafer W over the entire circumference. The rotary ring 2070 is coupled to the base plate 2061 and is provided to be rotatable integrally with the rotary plate 2060.

The rotary ring 2070 serves as a liquid receiver, and guides a processing liquid which has been supplied to the rear surface side of the wafer W by the processing liquid supply unit 2100 to be described below and used for processing the wafer W, to a drain cup 2051 so that the processing liquid is drained.

The rotary ring 2070 also serves a role of suppressing the processing liquid supplied to the rear surface side of the wafer W and scattered from the rotating wafer W to the outer periphery side, from being bounced to return to the wafer W or to turn around toward the top surface side of the wafer W. A more specific configuration of the rotary plate 2060 and the rotary ring 2070 will be described below with reference to drawings subsequent to FIG. 8A.

The rotary driving unit 2080 includes a pulley 2081, a driving belt 2082, and a motor 2083. The pulley 2081 is disposed at the periphery edge outside at the lower side of the rotation shaft 2062. The driving belt 2082 is wound around the pulley 2081.

The motor 2083 has an output shaft coupled to the driving belt 2082, and transfers a rotary driving force to the driving belt 2082 to rotate the rotation shaft 2062 through the pulley 2081. By the rotation of the rotation shaft 2062, the rotary plate 2060 and the rotary ring 2070 are integrally rotated. Hereinafter, the rotary plate 2060 and the rotary ring 2070 integrally rotated as described above may be collectively referred to as a "rotation unit."

The substrate lifting mechanism 2090 is provided in a liftable manner within the recessed portion 2061*a* of the base plate 2061 and the through hole 2062*a* of the rotation shaft 2062, and includes a lift pin plate 2091 and a lift shaft 2092. The lift pin plate 2091 has a plurality of lift pins 2091*a* (e.g., five lift pins 2091*a*) at the periphery edge thereof.

The lift shaft 2092 extends downwards from the lift pin plate 2091. A processing liquid supply pipe 2100*a* is provided at the center of the lift pin plate 2091 and the lift shaft 2092. A cylinder mechanism 2092*a* is connected to the lift shaft 2092 to lift the lift shaft 2092. Accordingly, the wafer W is lifted to be loaded and unloaded to/from the rotary plate 2060.

The processing liquid supply unit 2100 has the processing liquid supply pipe 2100*a*. As described above, the processing liquid supply pipe 2100*a* is provided to extend along the inner space of the lift pin plate 2091 and the lift shaft 2092.

Since the processing liquid supply pipe 2100*a* guides the processing liquid supplied from respective pipes of a processing liquid pipe group 2100*b* to the rear surface side of the wafer W, the processing liquid supply unit 2100 supplies the processing liquid to the rear surface side of the wafer W. The processing liquid supply pipe 2100*a* is communicated with a processing liquid supply port 2091*b* formed at the top surface of the lift pin plate 2091.

The recovery cup 2050 includes a drain cup 2051, a drainage pipe 2052, an exhaust cup 2053, and an exhaust pipe 2054. The recovery cup 2050 has an opening 2055 formed at the top surface thereof. The recovery cup 2050 mainly serves a role of recovering a gas and a liquid discharged from a space surrounded by the rotary plate 2060 and the rotary ring 2070.

The drain cup 2051 receives the processing liquid guided by the rotary ring 2070. The drainage pipe 2052 is connected to the bottom portion of the drain cup 2051 and discharges the processing liquid received by the drain cup 2051 through any of pipes of a drainage pipe group (not illustrated).

The exhaust cup 2053 is provided at the outside or lower side of the drain cup 2051 to communicate with the drain cup 2051. In the example illustrated in FIG. 7, the exhaust cup 2053 is provided at the periphery edge inside and the lower side of the drain cup 2051 to communicate with the drain cup 2051.

The exhaust pipe 2054 is connected to the bottom portion of the exhaust cup 2053 and exhausts a gas such as a nitrogen gas within the exhaust cup 2053 through any of pipes of an exhaust pipe group (not illustrated).

The top plate 2110 is provided in a liftable manner to close the opening 2055 formed at the top surface of the recovery cup 2050 in a lowered state. The top plate 2110 is provided to cover the wafer W supported by the support pins 2061b from the upper side when closing the opening 2055 formed at the top surface of the recovery cup 2050.

The periphery edge portion of the top plate 2110 facing the periphery edge portion of the wafer W supported by the support pins 2061b is provided to protrude downwards towards the wafer W, and forms a gap D1 between the periphery edge portion of the top plate 2110 and the periphery edge portion of the wafer W. The gap D1 is smaller than the distance between the central portion of the wafer W supported by the support pins 2061b and the top plate 2110.

The lifting mechanism 2120 includes an arm 2121 and a lift driving mechanism 2122. The lift driving mechanism 2122 is provided outside the recovery cup 2050 to be movable vertically. The arm 2121 is provided to interconnect the top plate 2110 and the lift driving mechanism 2122. That is, the lifting mechanism 2120 lifts the plate 2110 by the lift driving mechanism 2122 through the arm 2121.

The inert gas supply unit 2130 includes an inert gas supply pipe 2131 and an inert gas supply source 2132. The inert gas supply unit 2130 supplies an inert gas such as a nitrogen gas or an argon gas to the top surface side of the wafer W.

The inert gas supply pipe 2131 is provided to extend within the top plate 2110 and the arm 2121, and has one end connected to the inert gas supply source 2132 configured to supply an inert gas. The other end of the inert gas supply pipe 2131 is communicated with an inert gas supply port 2110a formed at the central portion of the top plate 2110.

As illustrated in FIG. 7, the arm 2121 may be preferably connected at substantially the center of the top surface of the top plate 2110. Then, since the inert gas supply port 2110a is formed at the central portion of the bottom surface of the top plate 2110, the inert gas may be supplied from the center of the top plate 2110 to the lower side, and the flow rate of the inert gas supplied to the wafer W may be uniform along the circumferential direction.

In the present exemplary embodiment, unlike in Japanese Patent Laid-Open Publication No. 2011-243627, the support pins 2061b are formed independently from the rotary ring 2070. Accordingly, the rotary ring 2070 does not need to have a role as a conduction path for electricity occurring in the wafer W. This expands a range of selection for the material of the rotary ring 2070.

Figure 8A:
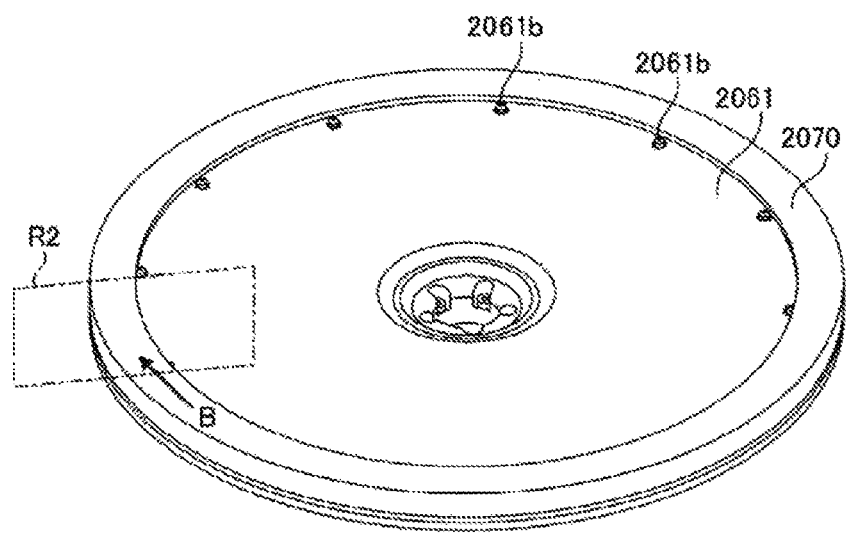
FIG. 8A is a perspective view of a rotation unit according to an exemplary embodiment.
Figure 8B:
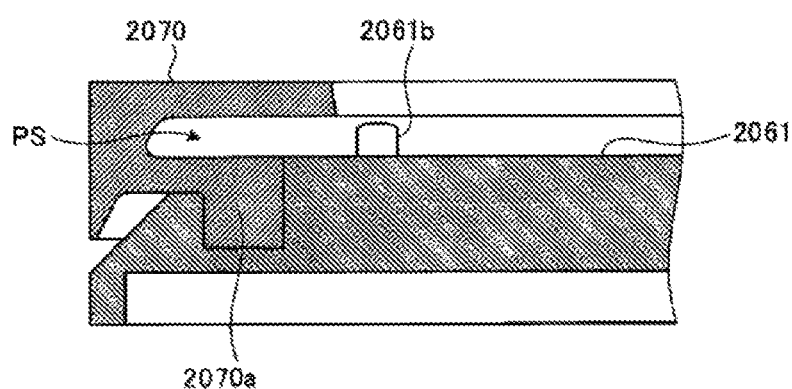
FIG. 8B is a schematic sectional view along an arrow B of the rotation unit according to the exemplary embodiment.

Hereinafter, the rotation unit according to the present exemplary embodiment will be described with reference to FIGS. 8A to 8G. FIG. 8A is a perspective view of a rotation unit according to an exemplary embodiment. FIG. 8B is a schematic sectional view along an arrow B of the rotation unit according to the exemplary embodiment. FIG. 8B is a substantially sectional view taken along the rectangle R2 illustrated in FIG. 8A.

As illustrated in FIG. 8A, the rotation unit according to the exemplary embodiment includes the base plate 2061 and the rotary ring 2070. On the top surface of the base plate 2061, support pins 2061b are provided at substantially equal intervals in the circumferential direction of the base plate 2061.

The support pins 2061b are, as described above, provided to protrude from the base plate 2061 while their tip portions are upwards. Also, the support pins 2061b support a wafer W from the lower side while the wafer W is floated above the base plate 2061.

As illustrated in FIG. 8B, unlike in Japanese Patent Laid-Open Publication No. 2011-243627, in the rotary ring 2070 when viewed from the section along the arrow B, an inner wall for forming a space PS is formed, and an engaging portion 2070a to be engaged with the base plate 2061 is provided.

The engaging portion 2070a is formed into a shape engageable with an engagement hole formed in the base plate 2061. By fitting the engaging portion 2070a to, for example, the engagement hole, the rotary ring 2070 is interlocked with the base plate 2061. The engagement method is not limited to fitting, but, for example, the engaging portion 2070a may be fastened by a fastening member from the rear surface side of the base plate 2061.

Figure 8C:
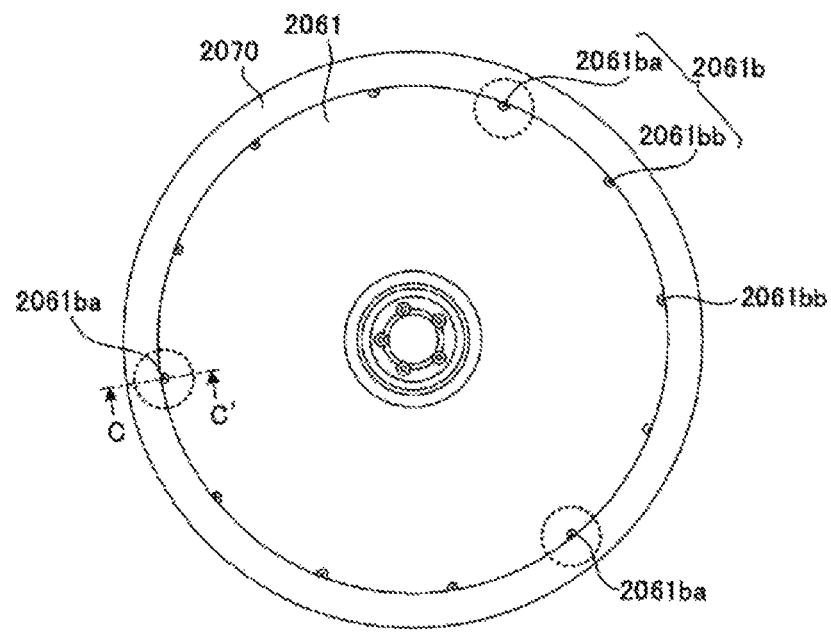
FIG. 8C is a plan view of the rotation unit according to the exemplary embodiment.
Figure 8D:
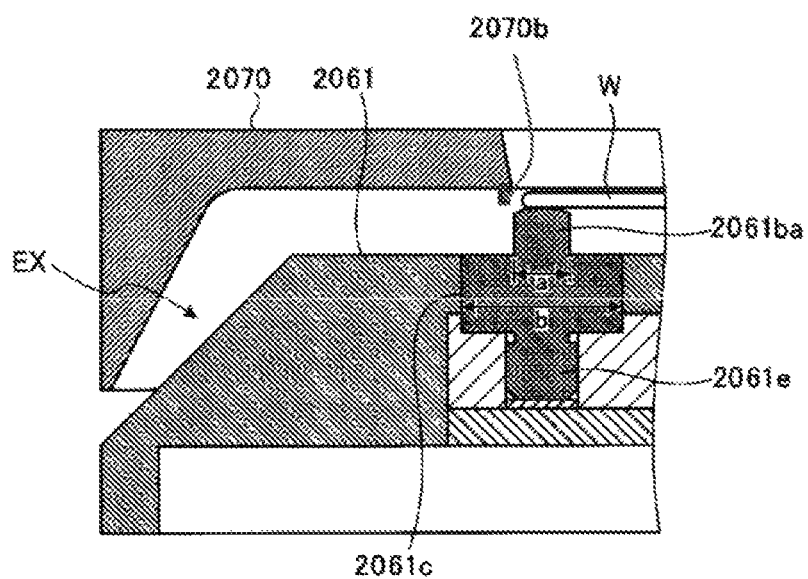
FIG. 8D is a schematic sectional view along line C-C' illustrated in FIG. 8C.

Subsequently, FIG. 8C is a plan view of the rotation unit according to the exemplary embodiment. FIG. 8D is a schematic sectional view along line C-C' illustrated in FIG. 8C.

As illustrated in FIG. 8C, the support pins 2061b are made of, for example, a resin, and two kinds of support pins including first support pins 2061ba and second support pins 2061bb are provided. When the first support pin 2061ba is compared with the second support pin 2061bb, the first support pin 2061ba is made of a material having a higher conductivity than the second support pin 2061bb.

Also, the second support pin 2061bb is made of a material having a higher chemical resistance than the first support pin 2061ba. The second support pin 2061bb may be formed of a material having no conductivity for reasons such as emphasis on durability.

As indicated by the closed curve surrounded by broken line in FIG. 8C, for example, three first support pins 2061ba are provided. The first support pins 2061ba are disposed at substantially equal intervals along the circumferential direction at the periphery edge of the base plate 2061, that is, at intervals of about 120°.

For example, three second support pins 2061bb are provided between two first support pins 2061ba at substantially equal intervals along the circumferential direction at the periphery edge of the base plate 2061. Accordingly, a total of twelve support pins 2061b are disposed at intervals of about 30°.

As illustrated in FIG. 8D, the support pin 2061b (here, the first support pin 2061ba) is formed to extend, for example, straightforwardly upwards.

Here, it is preferable that with respect to the width a of the tip portion, the width b of the main body is secured to a sufficient extent. By securing such a width b, it is possible to easily impart a torque required for holding the tip portion and tightening the support pin 2061b by, for example, a tool when the support pin 2061b is attached.

The descriptions will be made by referring back to FIG. 8D. The support pin 2061b includes a fastening portion 2061e at the bottom thereof, and is fastened to the base plate 2061 by being inserted into a fastening hole 2061c formed in the base plate 2061 from the top surface side of the base plate 2061.

As described above, since the support pin 2061b may be attached by being inserted from the top surface side of the base plate 2061, it is possible to easily perform, for example, individual replacement of the support pin 2061b without removing another member such as, for example, the rotary ring 2070.

That is, even when the expiration date of the first support pin 2061ba comes earlier than the second support pin 2061bb due to an influence of the processing liquid, it is possible to easily perform replacement of only the first support pin 2061ba.

As illustrated in FIG. 8D, a discharge port EX is formed between the base plate 2061 and the rotary ring 2070. The discharge port EX is a flow path configured to discharge an air stream occurring below the wafer W, or a processing liquid which has been used for processing the wafer W. In the rotary ring 2070, a protrusion 2070b is formed at the position corresponding to the outer periphery of the wafer W, in the vicinity of the inner periphery of the rotary ring 2070, to extend downwards from the rotary ring 2070. A plurality of protrusions 2070b are formed along the outer periphery of the wafer W, and extend to positions lower than the top surface of the wafer W. This suppresses the wafer W from moving out of the predetermined range, and falling from the support pins 2061b. When the protrusions 2070b are formed above the support pins 2061b, it is possible to more stably suppress the wafer W from moving and falling from the support pins 2061b. Here, the height of the wafer W on the support pins 2061b is fixed even when the wafer W has, for example, warpage. Thus, even when the wafer W has warpage, the wafer W may be suppressed from crawling below the protrusion 2070b. Then, it is possible to securely stop the horizontal movement of the wafer W. The lateral width (the horizontal length) of the protrusion 2070b is formed to be shorter than the lateral width (the horizontal length) of the support pin 2061b. This may suppress inhibition of a flow of a liquid on the substrate and a flow of an air stream. The length of the protrusion 2070b extending in the downward direction may be more preferably set such that the protrusion 2070b is placed at a higher position than the support pin 2061b for reasons of preventing the inhibition of a flow of a liquid on the substrate and a flow of an air stream.

Figure 8E:
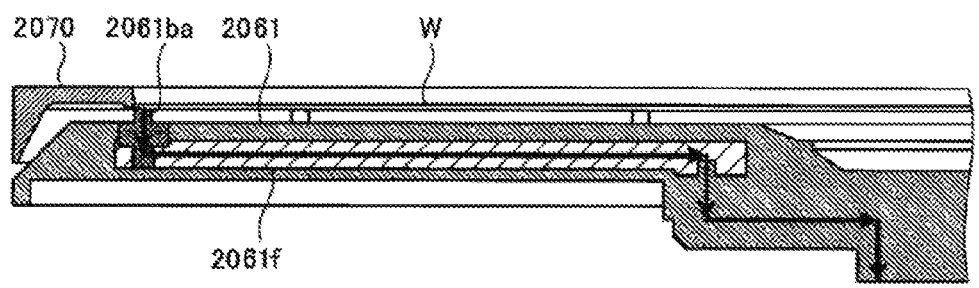
FIG. 8E is an explanatory view of a conduction path of the rotation unit according to the exemplary embodiment.

Subsequently, FIG. 8E is an explanatory view of a conduction path of the rotation unit according to the present exemplary embodiment. As indicated by arrows of FIG. 8E, in the present exemplary embodiment, when the wafer W is placed on the rotation unit, the electricity occurring in the wafer W is conducted from the first support pin 2061ba made of a conductive material to the inside of the base plate 2061.

A conductive member 2061f is provided within the base plate 2061, and is in contact with the first support pin 2061ba. Accordingly, the electricity is conducted from the first support pin 2061ba to the conductive member 2061f.

The conductive member 2061f extends to the vicinity of the rotation shaft 2062, and the electricity guided by the conductive member 2061f is conducted to the rotation shaft 2062.

That is, in the present exemplary embodiment, a conduction path is formed from the first support pin 2061ba through the conductive member 2061f, and thus charges of the wafer W are eliminated. That is, in the present exemplary embodiment, when the wafer W is placed on the rotation unit, the wafer W is electrically conductive through the first support pin 2061ba and the conductive member 2061f.

Figure 8F:
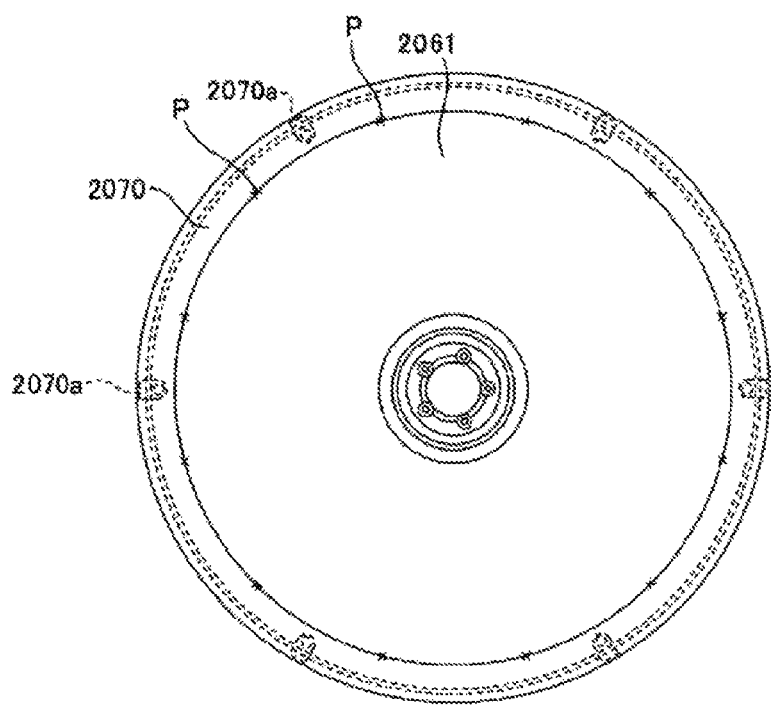
FIG. 8F is a plan schematic view illustrating an arrangement relationship between a support pin and an engaging portion.
Figure 8G:
FIG. 8G is a perspective view illustrating an arrangement relationship between the support pin and the engaging portion.

Subsequently, FIG. 8F is a plan schematic view illustrating an arrangement relationship between the support pin 2061b and the engaging portion 2070a. In FIG. 8F, the arrangement position of the support pin 2061b is indicated by "x," and denoted by reference numeral P. FIG. 8G is a perspective view illustrating an arrangement relationship between the support pin 2061b and the engaging portion 2070a.

As illustrated in FIG. 8F, the above described engaging portions 2070a which couple and integrate the base plate 2061 with the rotary ring 2070 are provided at substantially equal intervals along the circumferential direction of the rotary ring 2070, for example, at six locations. Each of engaging portions 2070a is disposed to be located between arrangement positions P of the support pins 2061b.

Specifically, as illustrated in FIG. 8G, for example, each of engaging portions 2070a is disposed to be located at substantially the center between the first support pin 2061ba having a high conductivity and the second support pin 2061bb having a low conductivity (no conductivity).

When the engaging portion 2070a is disposed between the support pins 2061b as described above, it may be said that the arrangement relationship between the support pin 2061b and the engaging portion 2070a is symmetrical in plan view. Accordingly, the processing liquid and the above described air stream may be allowed to substantially uniformly flow to spread along the top surface of the base plate 2061.

The engaging portions 2070a integrate the base plate 2061 with the rotary ring 2070, and thus do not disturb the processing liquid and the air stream.

That is, it is possible to substantially uniformly process the rear surface side of the wafer W without causing a disturbance, thereby contributing to a quality improvement of the processed result of the wafer W.

As described above, in the present exemplary embodiment, the plurality of support pins 2061b are provided on the top surface of the base plate 2061 independently from the rotary ring 2070. Accordingly, it is possible to easily perform replacement without removing other members including the rotary ring 2070. Thus, as compared to a case where the support pins 2061b are formed integrally with the rotary ring 2070, the maintenance may be easily performed.

Even when the support pin 2061b is replaced, the rotary ring 2070 does not need to be replaced. Thus, a cost for maintenance may be suppressed. The rotary ring 2070 itself may be subjected to the maintenance separately from the support pin 2061b. As described above, according to the present exemplary embodiment, it is possible to improve the maintainability of the substrate processing system 2001.

Some of the support pins 2061b are imparted a conductivity and used to form a conduction path. This may suppress charging of the wafer W. There is no need to allow the rotary ring 2070 to have a role of a conduction path. This expands a range of selection for the material of the rotary ring 2070.

In the exemplary embodiment described above, twelve support pins 2061b and six engaging portions 2070a are provided, but the numbers of these parts are not limited.

In the exemplary embodiment described above, it is described that among the twelve support pins 2061b, three are the first support pins 2061ba. However, the number or ratio of the first support pins 2061ba is not limited. The number of the first support pins 2061ba may be properly adjusted according to whether charges of the wafer W are suitably eliminated.

When the number of the first support pins 2061ba whose replacement frequency is considered to be relatively high is set to be smaller than the number of the second support pins 2061bb, the replacement frequency of the support pins 2061b in the whole of the rotation unit may be reduced.

As described above, according to an aspect of an exemplary embodiment, it is possible to improve the maintainability of the apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
   a substrate rotary-holding unit configured to rotate a substrate while holding the substrate; and
   a processing liquid supply unit configured to supply a processing liquid to the substrate held by the substrate rotary-holding unit,
   wherein the substrate rotary-holding unit includes:
   a base plate disposed spaced apart from the substrate below the substrate and including an inclined outer peripheral surface provided at an outer circumferential edge thereof and extending in a downward and outward direction;
   a cover member supported on the base plate by a support portion thereof and disposed outside an outer periphery of the substrate, the cover member including a ceiling wall and an outer periphery wall provided with an inclined inner peripheral surface extending in a downward and outward direction at a lower end portion of the outer periphery wall to face the inclined outer peripheral surface of the base plate;
   a gap serving as a horizontal flow path and formed between a lower surface of the ceiling wall and an upper surface of the support portion, the upper surface of the support portion being formed on the same plane as a top surface of the base plate;
   a discharge port formed between the base plate and the cover member and configured to discharge an air stream and a liquid stream occurring below the substrate;
   an inclined flow path formed between the inclined inner peripheral surface of the outer periphery wall of the cover member and the inclined outer peripheral surface of the base plate,
   wherein the support portion of the cover member protrudes outwards from the top surface of the base plate to be connected to the cover member,
   the gap is communicated with the inclined flow path through the discharge port such that the air stream and the liquid stream occurring below the substrate flow into the discharge port without colliding with the support portion of the cover member to flow through the inclined flow path,
   a plurality of the support portions of the cover member are formed between a plurality of substrate holders configured to support the substrate and provided at intervals along the outer periphery of the substrate, and
   the support portion of the cover member includes:
   a support piece formed at the inclined inner peripheral surface of the outer periphery wall of the cover member; and
   a support protrusion formed at a distal end of the support piece to vertically extend.

2. The substrate liquid processing apparatus of claim 1, wherein the support portion of the cover member is formed below a bottom surface of the substrate.

3. The substrate liquid processing apparatus of claim 1, wherein the processing liquid supply unit supplies the processing liquid to the bottom surface of the substrate, and the discharge port discharges the processing liquid supplied from the processing liquid supply unit.

4. The substrate liquid processing apparatus of claim 1, wherein both the plurality of the support portions of the cover member and the plurality of substrate holders are formed at equal intervals along the outer periphery of the substrate.

5. The substrate liquid processing apparatus of claim 1, comprising a plurality of support members provided on the top surface of the base plate to support the substrate.

6. The substrate liquid processing apparatus of claim 5, wherein the plurality of support members include a first support member made of a conductive resin,
   a conductive member is disposed within the base plate to be in contact with the first support member, and
   the substrate is electrically conductive through the first support member and the conductive member.

7. The substrate liquid processing apparatus of claim 6, wherein the plurality of support members include a second support member made of a resin having a conductivity lower than the first support member.

8. The substrate liquid processing apparatus of claim 7, wherein the number of the first support members is smaller than the number of the second support members.

9. The substrate liquid processing apparatus of claim 5, wherein the support members are detachable from the top surface side of the base plate.

10. The substrate liquid processing apparatus of claim 5, wherein a plurality of protrusions are formed on the cover member to extend downwards from the cover member, and
    the plurality of protrusions are formed at a plurality of locations along the outer periphery of the substrate to extend to positions lower than a top surface of the substrate.

11. A substrate liquid processing method comprising:
    providing a substrate liquid processing apparatus including:
    a substrate rotary-holding unit configured to rotate a substrate while holding the substrate; and
    a processing liquid supply unit configured to supply a processing liquid to the substrate held by the substrate rotary-holding unit,
    wherein the substrate rotary-holding unit includes:
    a base plate disposed spaced apart from the substrate below the substrate and including an inclined outer peripheral surface provided at an outer circumferential edge thereof and extending in a downward and outward direction;
    a cover member supported on the base plate by a support portion thereof and disposed outside an outer periphery of the substrate, the cover member including a ceiling wall and an outer periphery wall provided with an inclined inner peripheral surface extending in a downward and outward direction at a lower end portion of the outer periphery wall to face the inclined outer peripheral surface of the base plate;
    a gap serving as a horizontal flow path and formed between a lower surface of the ceiling wall and an upper surface of the support portion, the upper surface of the support portion being formed on the same plane as a top surface of the base plate;

a discharge port formed between the base plate and the cover member and configured to discharge an air stream and a liquid stream occurring below the substrate;

an inclined flow path formed between the inclined inner peripheral surface of the outer periphery wall of the cover member and the inclined outer peripheral surface of the base plate, wherein the support portion of the cover member protrudes outwards from the top surface of the base plate to be connected to the cover member, the gap is communicated with the inclined flow path through the discharge port such that the air stream and the liquid stream flow into the gap without colliding with the support portion of the cover member, a plurality of the support portions of the cover member are formed between a plurality of substrate holders configured to support the substrate and provided at intervals along the outer periphery of the substrate, and the support portion of the cover member includes:
a support piece formed at the inclined inner peripheral surface of the outer periphery wall of the cover member; and
a support protrusion formed at a distal end of the support piece to vertically extend, rotating the substrate by the substrate rotary-holding unit while holding the substrate, supplying the processing liquid to the substrate from the processing liquid supply unit and performing a liquid processing on the substrate by the processing liquid, and discharging, during the liquid processing, the air stream and the liquid stream occurring below the substrate into the discharge port without colliding with the support portion of the cover member to flow through the inclined flow path.

* * * * *